US008957326B2

(12) United States Patent
Tzou et al.

(10) Patent No.: US 8,957,326 B2
(45) Date of Patent: Feb. 17, 2015

(54) COMPOSITE DUAL BLACKENED COPPER FOIL AND METHOD OF MANUFACTURING THE SAME

(71) Applicant: Nan Ya Plastics Corporation, Taipei (TW)

(72) Inventors: Ming-Jen Tzou, Taipei (TW); Kuo-Chao Chen, Taipei (TW); Pi-Yaun Tsao, Taipei (TW)

(73) Assignee: Nan Ya Plastics Corporation, Taipei (TW)

( * ) Notice: Subject to any disclaimer, the term of this patent is extended or adjusted under 35 U.S.C. 154(b) by 0 days.

(21) Appl. No.: 13/958,750

(22) Filed: Aug. 5, 2013

(65) Prior Publication Data
US 2014/0220373 A1    Aug. 7, 2014

(30) Foreign Application Priority Data

Feb. 6, 2013    (TW) ................................ 102104586 A

(51) Int. Cl.
*H05K 9/00*        (2006.01)
*B32B 15/20*      (2006.01)
(Continued)

(52) U.S. Cl.
CPC .................. *B32B 15/20* (2013.01); *B32B 15/04* (2013.01); *C25D 5/14* (2013.01); *C25D 3/58* (2013.01); *C25D 7/0614* (2013.01); *H05K 9/0096* (2013.01); *C25D 5/48* (2013.01)
USPC ........... 174/389; 174/381; 174/392; 174/394; 428/624; 428/675; 205/183; 205/191; 205/194

(58) Field of Classification Search
USPC .......... 428/624, 675; 174/381, 389, 392, 394; 205/183, 191, 193, 194
See application file for complete search history.

(56) References Cited

U.S. PATENT DOCUMENTS 5,366,814 A * 11/1994 Yamanishi et al. ............ 428/607
7,037,594 B2 * 5/2006 Kojima et al. ................. 428/601
(Continued)

FOREIGN PATENT DOCUMENTS

TW       I263461 B      10/2006
TW       200718347       5/2007
(Continued)

OTHER PUBLICATIONS

Communication From the European Patent Office Regarding a Counterpart Foreign Application Dated May 22, 2014.
(Continued)

*Primary Examiner* — Cathy Lam
(74) *Attorney, Agent, or Firm* — Rosenberg, Klein & Lee

(57) ABSTRACT

A composite dual blackened copper foil includes a copper foil and two blackened layers. The copper foil has a shiny side and a matte side. The blackened layers are formed on the shiny and matte sides respectively. The blackened layers are formed alloy by electroplating in a plating bath consisting essentially of copper, cobalt, nickel, manganese, magnesium and sodium ions. A rough layer is selectively formed between the blackened layer and the shiny side as well as the matte side. Both side of the copper foil is spotless, powder free, and good in etching quality. The copper foil is effective at blocking electromagnetic wave, near infrared, undesired light and the like. The copper foil exhibits strong light absorption and is applicable to direct gas laser drilling. A method of manufacturing the composite dual blackened copper foil is also provided.

11 Claims, 4 Drawing Sheets

(51) Int. Cl.
*B32B 15/04* (2006.01)
*C25D 5/14* (2006.01)
*C25D 3/58* (2006.01)
*C25D 7/06* (2006.01)
*C25D 5/48* (2006.01)

(56) References Cited

U.S. PATENT DOCUMENTS

| | | | |
|---|---|---|---|
| 7,052,781 B2 | 5/2006 | Chen et al. | |
| 7,304,250 B2 * | 12/2007 | Arakawa et al. | 174/381 |
| 7,371,450 B2 * | 5/2008 | Arakawa et al. | 428/138 |
| 7,491,902 B2 * | 2/2009 | Naito et al. | 174/389 |
| 7,642,469 B2 * | 1/2010 | Arakawa et al. | 174/381 |
| 7,732,038 B2 * | 6/2010 | Naito et al. | 428/138 |
| 7,842,397 B2 * | 11/2010 | Ito et al. | 428/607 |
| 7,859,179 B2 * | 12/2010 | Arakawa et al. | 313/238 |
| 2007/0181326 A1 | 8/2007 | Naito et al. | |

FOREIGN PATENT DOCUMENTS

| | | |
|---|---|---|
| WO | 2006/001594 A1 | 1/2006 |
| WO | 2006/004298 A1 | 1/2006 |

OTHER PUBLICATIONS

Communication From the Taiwan Patent Office Regarding a Counterpart Foreign Application Dated (Taiwan Year 103) Aug. 27, 2014.

* cited by examiner

S/S

M/S

US 8,957,326 B2

COMPOSITE DUAL BLACKENED COPPER FOIL AND METHOD OF MANUFACTURING THE SAME

BACKGROUND

1. Field of the Invention

The instant disclosure relates to a surface treated copper foil; in particular, to a composite dual blackened surface treated copper foil and method of manufacturing the same.

2. Description of Related Art

Large screen and high speed plasma display panel (PDP) has been widely used in a variety of display devices.

In general, the plasma display panel generates plasma from electrically charged ionized gases. The visible light is produced by exiting phosphors painted on the cells by ultraviolet (UV) photons. However, in the formation of visual image, in addition to UV photons, photons are also generated from near infrared range. The wavelength of near infrared light is close to the one used in the optic communication. As a result, near field interference may occur, for example, with microwave or super-low frequency electromagnetic waves.

The near infrared photon leakage or electromagnetic wave interference is reduced by the addition of a shielding layer made of copper foil in front of the display panel. The shielding layer is formed by the copper foil, which are etched into a mesh/reticular structure. However, the image contrast ratio is reduced because the copper foil shines and reflects external light. Furthermore, the copper foil reflects the internal light and leads to low light permeability, causing lower visibility.

The above mentioned problems are resolved by undergoing copper foil blackening treatment. However, only one side of the copper foil is treated in conventional surface treatment in conventional techniques. Thus, light reflection by the copper foil still exists on the untreated side. The untreated side is then processed in the subsequent fabrication process and the cost rises as well. In addition, because electronic components are minimized and arranged in high density, the wiring on printed circuit board is more compact. Laser drilling replaces traditional mechanical drilling to conduct more delicate pinhole formation on the printed circuit board. $CO_2$ gas laser with a wavelength of 10 µm which causes nearly 100% reflection on copper foil. That is to say, the conventional $CO_2$ gas laser is an ineffective drilling tool on copper foil.

Moreover, conformal mask is used in the HDI process. The copper foil surface is blackened so as to effectively absorb light by the black oxidized layer and the conventional gas laser drilling can be applied. Alternatively, copper foil is thinned first and then drilled by gas laser. The above-mentioned means still have the problems of low production rate, complex process and high cost.

SUMMARY OF THE INVENTION

A copper foil is rinsed by acidic copper sulfate solution to wash off the particles on the surface. Then the copper foil is bathed in copper sulfate solution for electroplating on both sides. Then the copper foil is blackened electroplated on both sides. The copper foil configuration and type of electroplating process affect the evenness and color of the blackened layer.

The objective of the instant disclosure is to provide a composite dual blackened copper foil. Both sides of the copper foil are blackened, therefore the shiny and matte sides are blackened, smooth, powder free and suitable for etching. The surface treated copper foil is applicable in PDP, EMI, HDI manufacturing, direct laser drilling, inner layer formation, FCCL and FPC.

According to one embodiment of the instant disclosure, the composite dual blackened copper foil includes one copper foil and two blackened layers. The copper foil has a shiny side and a matte side. The blackened layers are disposed on the shiny and matte sides respectively. The blackened layers are made of an alloy by electroplating in a bath consisting essentially of copper, cobalt, nickel, manganese, magnesium, and sodium ions.

One embodiment of the instant disclosure further includes two rough layers. One of the rough layers is disposed between one of the two blackened layers and the shiny side whereas the other rough layer is disposed between the other one of the two blackened layers and the matte side.

The method of manufacturing the composite dual blackened copper foil includes: firstly providing a cooper foil having a shiny side and a matte side. Subsequently, the shiny and matte sides are washed by acidic solution. Then a first rough layer is formed on the shiny side and a second rough layer on the matte side. The first blackened layer is formed on the first rough layer and a second blackened layer is formed on the second rough layer. The first and second blackened layers are alloy electroplated in a plating bath consisting essentially of copper, cobalt, nickel, manganese, magnesium and sodium ions.

In summary, the blackened layer of the composite dual blackened copper foil is made by electroplating in a bath consisting essentially of copper, cobalt, nickel, manganese, magnesium, and sodium ions. The pitch black appearance on both sides of the copper foil effectively reduces light reflection from exterior or plasma display panel (internal screen) and therefore enhances the contrast ratio and resolution.

Additionally, the blackened layer exhibits shielding property for blocking electromagnetic waves, near infrared, undesired scattered light and the like. The composite dual blackened copper foil is applicable to PDP, EMI, HDI manufacturing, direct laser drilling, inner layer formation, FCCL, FPC and the like.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
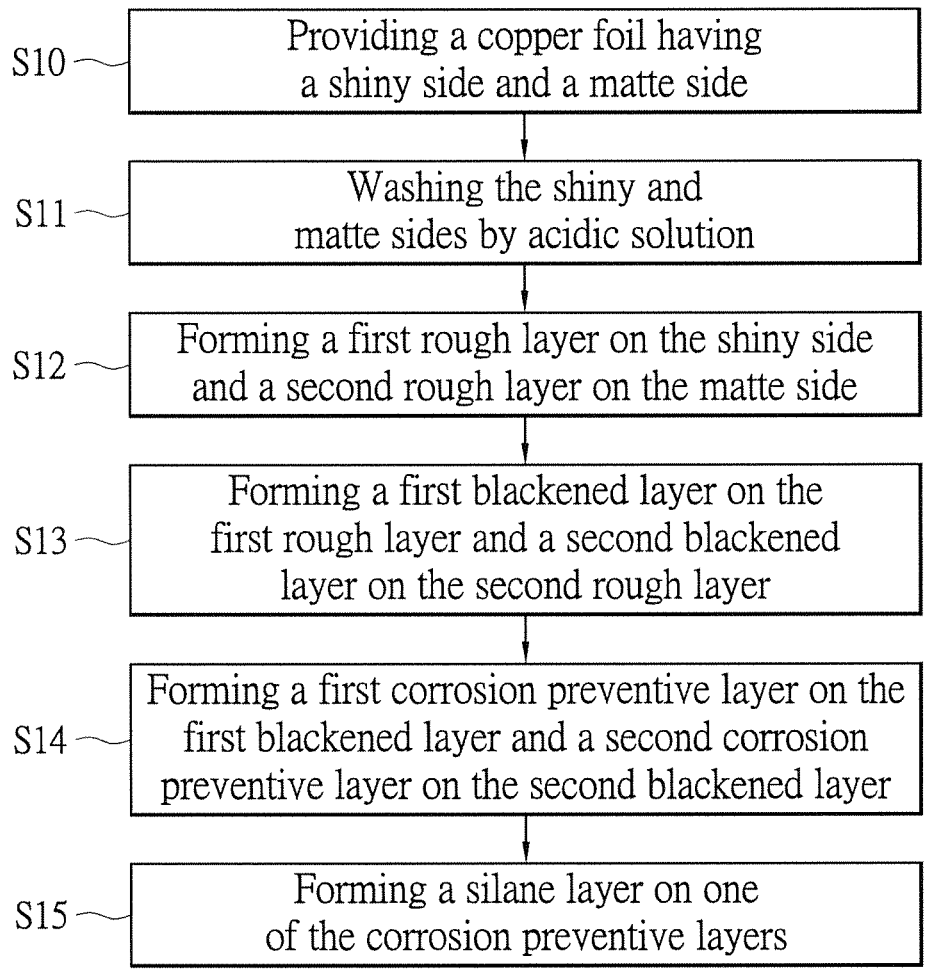
FIG. 1 is a flow chart showing a method of manufacturing a composite dual blackened copper foil in accordance with an embodiment of the instant disclosure.
Figure 2:
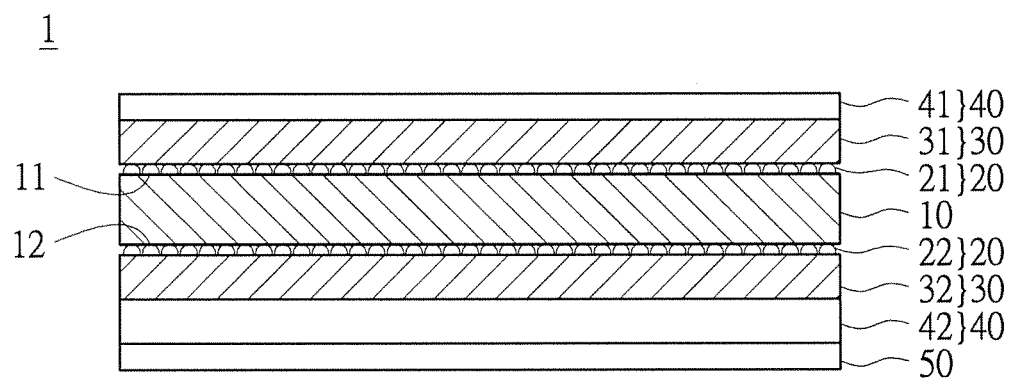
FIG. 2 is a cross sectional view of a composite dual blackened copper foil in accordance with an embodiment of the instant disclosure.

Attention is now invited to FIGS. 1 and 2. FIG. 1 is a flow chart showing a method of manufacturing a composite dual blackened copper foil. FIG. 2 shows a cross sectional view of the composite dual blackened copper foil made by the method. The instant disclosure is further elaborated by the embodiment herein but not limited thereby.

First Embodiment

Step S10: providing a copper foil 10. The copper foil includes a shiny side 11 and a matte side 12. In the instant embodiment, the copper foil 10 has a thickness ranging between 6 to 35 μm and a roughness (Rz) below 1.5. Specifically, due to the manufacturing process, the copper foil 10 has fine particles on the cathode portion, resulting in brighter and smoother appearance. The cathode portion is therefore called shiny side 11. In contrast, on the anode portion of the copper foil 10, the morphology resembles pillar particles, resulting in rougher and pinkish appearance compared to the shiny side 11. The anode portion is therefore called matte side 12.

Step S11: washing the shiny side 11 and matte side 12 of the copper foil 10 by acidic solution. Specifically, the acidic solution includes copper (II) sulfate pentahydrate in a concentration of 225 g/L and sulfate in a concentration of 95 g/L. The rinsing time is approximately 8 seconds to remove any residues on the shiny side 11 and matte side 12 of the copper foil 10. After the acidic washing, the copper foil 10 is further rinsed by water to clear the surfaces thereof and prevent the acidic solution from affecting the subsequent processing.

Step S12 is to form a rough layer 20. In step S12, a first rough layer 21 is formed on the shiny side 11 and a second rough layer 22 is formed on the matte side 12. Specifically, the copper foil 10 is dipped in a electroplating bath including 86 g/L of copper (II) sulfate pentahydrate, 95 g/L sulfate and 15 ppm sodium phosphotungstate hydrate ($Na_2O.P_2O_5.12WO_3.18H_2O$). The bathing temperature is maintained at 25° C., the plating current density ranges between 10.8 A/dm$^2$ to 20.6 A/dm$^2$ and the bathing time is approximately 6.5 seconds. Step S12 is a pre-processing procedure of the shiny side 11 and the matte side 12.

Subsequently, the copper foil 10 is washed in water and bathed in the same plating bath again. This time the plating current density ranges between 1.34 A/dm$^2$ to 2.59 A/dm$^2$ for approximately 9.7 seconds. The cupric rough morphology (not shown in the figure) is then formed on the shiny side 11 and the matte side 12 of the copper foil 10. The copper foil 10 is washed again by water and electroplated in the same plating bath with the same ingredients. The rough layer 20 then completely coats the shiny side 11 and the matte side 12 of the copper foil 10. The bond strength between the composite dual blackened copper foil 1 and a substrate (not shown) is further enhanced by the presence of the rough layer 20.

Step S13: forming a blackened layer 30. The step S13 includes the formation of a first blackened layer 31 on the first rough layer 21 and a second blackened layer 32 on the second rough layer 22. Specifically, the copper foil 10 having complete rough layer 20 is cleaned by water firstly and electroplated in the plating bath consisting essentially of 65 g/L copper sulfate pentahydrate, 9 g/L nickel sulfate hexahydrate, 45 g/L cobalt sulfate heptahydrate, 20 g/L manganese sulfate hydrate, 35 g/L magnesium sulfate heptahydrate and 95 g/L sodium citrate dihydrate.

Figure 3A:
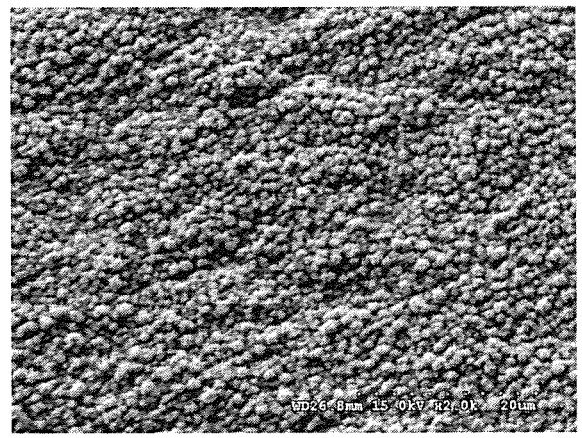
FIG. 3A is a diagram from a scanning electronic microscope showing a shiny side (S/S) of a composite dual blackened copper foil in accordance with a first embodiment of the instant disclosure.
Figure 3B:
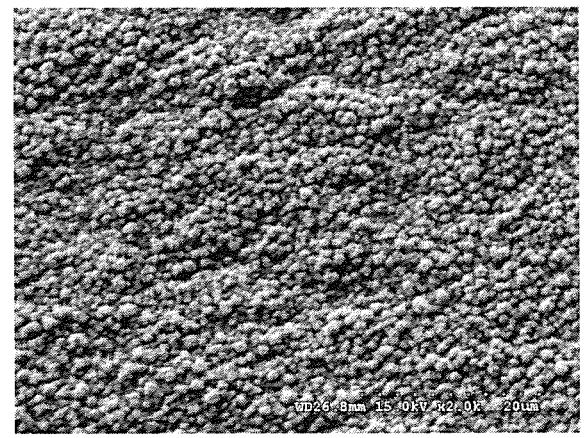
FIG. 3B is a diagram from a scanning electronic microscope showing a matte side (M/S) of a composite dual blackened copper foil in accordance with a first embodiment of the instant disclosure.

In the instant embodiment, the bath temperature is 35° C., pH 5.5, and plating current density ranges between 6 A/dm$^2$ to 8 A/dm$^2$. The copper foil 10 is treated in the bath for approximately 15 seconds. The blackened layers 30 are formed on the first and second rough layers 21, 22 respectively and the copper foil 10 has thick black appearance on both sides. Please refer to FIGS. 3A and 3B. The first and second blackened layers 31, 32 are spotless and powder free.

Step S14: forming a corrosion preventive layer 40. The step S14 includes the formation of a first corrosion preventive layer 41 on the first blackened layer 31 and a second corrosion preventive layer 42 on the second blackened layer 32. Specifically, the copper foil 10 having the completed rough layer 20 and blackened layer 30 is washed by water firstly and then electroplated. The plating bath consists essentially of 3 g/L zinc sulfate heptahydrate, 2 g/L chromic acid and 25 g/L sodium hydroxide. The bath temperature is 60° C. while plating current density is 1 A/dm$^2$. The copper foil 10 is treated for approximately 7 seconds and the corrosion preventive layer 40 is formed on the first and second blackened layers 31, 32, preventing rust formation.

Step S15: forming a silane layer 50 on either the first or second corrosion preventive layer 41, 42. Specifically, the copper foil 10 is washed by water, and then 0.5 wt % 3-amino trimethylsilane is sprayed on the first or second corrosion preventive layer 41, 42. Subsequently, the copper foil 10 is roasted in an oven at 150° C. for 8 seconds to complete the formation of the silane layer 50 on one of the corrosion preventive layers 41, 42.

Furthermore, the silane layer 50 can be an insulation layer, optical layer, release layer, or fog proofing layer for various intended purposes. The surface can be treated to exhibit hydrophilicity, hydrophobicity, orientation, absorption or transmission of electrons. The property of the composite dual blackened copper foil 1 is shown in Table 2.

Second Embodiment

The difference between the first and second embodiments arises from the Step S12 and the remaining process is identical. Specifically, the copper foil 10 is electroplated in a plating bath consisting essentially of 86 g/L copper sulfate pentahydrate, 95 g/L sulfate and 400 ppm arsenic trioxide. The bath temperature is 25° C., and the plating current density ranges between 13.8 A/dm$^2$ to 22.6 A/dm$^2$. The copper foil 10 is treated for approximately 6.5 seconds for pre-processing the shiny side 11 and matte side 12.

Subsequently, the copper foil 10 is washed by water and electroplated in the same plating bath. The plating current density ranges between 1.74 A/dm$^2$ to 2.89 A/dm$^2$ and the plating time takes 9.7 seconds. The rough morphology on the shiny side 11 and matte side 12 of the copper foil 10 is formed by copper. Again, the copper foil 10 is washed by water and electroplated in the same plating bath under identical conditions. The rough layer 20 is then completed on the shiny side 11 and the matte side 12 of the copper foil 10 to enhance the bond strength between the composite dual blackened copper foil 1 and a substrate.

In short, in the second embodiment, the ingredients of the plating bath and treatment conditions are altered. The property of the composite dual blackened copper foil 1 made in the second embodiment is shown in Table 2.

Third Embodiment

The difference between the first and third embodiments lies on the step S13 and the remaining process is identical. Specifically, the copper foil 10 having complete rough layer 20 is electroplated in a plating bath consisting essentially of 55 g/L copper sulfate pentahydrate, 12 g/L nickel sulfate hexahydrate, 45 g/L cobalt sulfate heptahydrate, 20 g/L manganese sulfate hydrate, 35 g/L magnesium sulfate heptahydrate and 95 g/L sodium citrate dihydrate.

That is to say in the third embodiment, the copper sulfate pentahydrate concentration is decreased while the nickel sulfate hexahydrate concentration is increased. The property of the composite dual blackened copper foil 1 made in the third embodiment is shown in Table 2.

Fourth Embodiment

The first and fourth embodiments are similar but different in step S13. Specifically, the copper foil 10 having complete rough layer 20 is electroplated in a plating bath consisting essentially of 65 g/L copper sulfate pentahydrate, 9 g/L nickel sulfate hexahydrate, 45 g/L cobalt sulfate heptahydrate, 27 g/L manganese sulfate hydrate, 48 g/L magnesium sulfate heptahydrate and 95 g/L sodium citrate dihydrate.

In the fourth embodiment, the concentration of manganese sulfate hydrate and magnesium sulfate heptahydrate are increased. The property of the composite dual blackened copper foil 1 in accordance with the fourth embodiment is shown in Table 2.

Fifth Embodiment

The difference between the first and the fifth embodiment arises from step S13 while the rest remains the same. Specifically, the copper foil 10 having complete rough layer 20 is electroplated in a plating bath consisting essentially of 65 g/L copper sulfate pentahydrate, 9 g/L nickel sulfate hexahydrate, 45 g/L cobalt sulfate heptahydrate, 20 g/L manganese sulfate hydrate, 35 g/L magnesium sulfate heptahydrate and 115 g/L sodium citrate dihydrate.

In other words, in the fifth embodiment, the sodium citrate dihydrate concentration is increased. The property of the composite dual blackened copper foil 1 made in the fifth embodiment is shown in Table 2.

Sixth Embodiment

The difference between the first and sixth embodiments lies in the step S13 and the remaining process is identical. Specifically, the copper foil 10 having the complete rough layer 20 is electroplated in a plating bath consisting essentially of 65 g/L copper sulfate pentahydrate, 9 g/L nickel sulfate hexahydrate, 38 g/L cobalt sulfate heptahydrate, 20 g/L manganese sulfate hydrate, 48 g/L magnesium sulfate heptahydrate and 95 g/L sodium citrate dihydrate.

The concentration of cobalt sulfate heptahydrate is decreased. The property of the composite dual blackened copper foil 1 made in the sixth embodiment is listed in Table 2.

Seventh Embodiment

Figure 4:
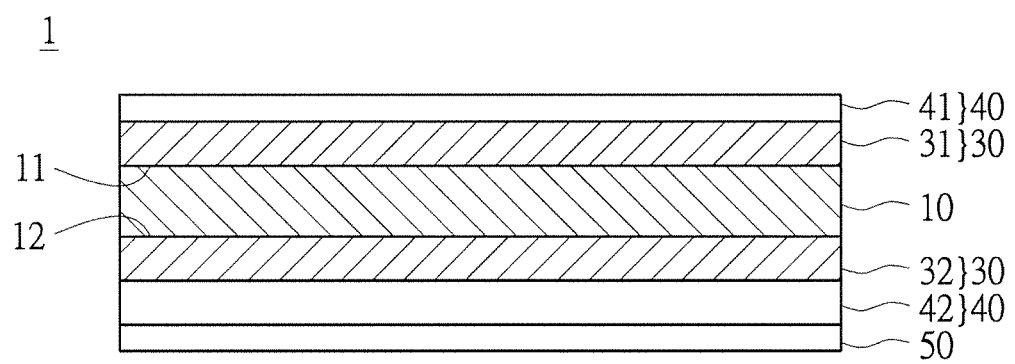
FIG. 4 is a cross sectional view of a composite dual blackened copper foil in accordance with a seventh embodiment of the instant disclosure.

Please refer to FIG. 4. The difference between the first and seventh embodiments arises from that step S12 is skipped in the seventh embodiment. Specifically, the copper foil 10 is electroplated in a plating bath consisting essentially of 70 g/L copper sulfate pentahydrate, 12 g/L nickel sulfate hexahydrate, 50 g/L cobalt sulfate heptahydrate, 25 g/L manganese sulfate hydrate, 40 g/L magnesium sulfate heptahydrate and 135 g/L sodium citrate dihydrate.

In the seventh embodiment, the first and second rough layers 21, 22 are not formed on the composite dual blackened copper foil 1. Therefore the first blackened layer 31 is formed on the shiny side 11 of the copper foil while the second blackened layer 32 is formed on the matte side 12 of the copper foil 10. The first and second blackened layers 31, 32 show stronger pitch of black.

Comparative Example 1

The comparative example 1 differs from the first embodiment because step S12 is skipped. In other words, the rough layer 20 is absent yet the remaining process is the same. The property of the composite dual blackened copper foil 1 made in the comparative example 1 is listed in Table 2.

Comparative Example 2

The difference between the present example and the first embodiment arises from step S13 and the rest remains the same. Specifically, the copper foil 10 having the complete rough layer 20 is electroplated in a plating bath consisting essentially of 65 g/L copper sulfate pentahydrate, 9 g/L nickel sulfate hexahydrate, 45 g/L cobalt sulfate heptahydrate, 20 g/L manganese sulfate hydrate, 35 g/L magnesium sulfate heptahydrate and 70 g/L sodium citrate dihydrate.

The concentration of sodium citrate dihydrate is reduced in the comparative example 2. The property of the composite dual blackened copper foil made in the comparative example 2 is listed in Table 2.

Comparative Example 3

The difference between the comparative example 3 and the first embodiment lies on step S13 and the rest process is identical. Specifically, the copper foil 10 is electroplated in a plating bath consisting essentially of 65 g/L copper sulfate pentahydrate, 9 g/L nickel sulfate hexahydrate, 45 g/L cobalt sulfate heptahydrate, 20 g/L manganese sulfate hydrate and 95 g/L sodium citrate dehydrate.

In other words, in the third treatment, the magnesium sulfate heptahydrate is absent in the plating bath. The property of the composite dual blackened copper foil 1 made by the comparative example 3 is shown in Table It is worth mentioning that if the concentration of copper sulfate pentahydrate in the plating bath is less than 40 g/L, the pitch of black is inadequate. To the contrary, if the concentration of copper sulfate pentahydrate in the plating bath is more than 80 g/L, copper particles may fall from the copper foil. If the concentration of nickel sulfate hexahydrate in the plating bath is less than 5 g/L, the pitch of black is inadequate. If the concentration of nickel sulfate hexahydrate in the plating bath is more than 15 g/L, the etching quality may reduce. If the concentration of cobalt sulfate heptahydrate in the plating bath is less than 30 g/L, the pitch of black is inadequate. If the concentration of cobalt sulfate heptahydrate in the plating bath is more than 60 g/L, spots may appear. If the concentration of manganese sulfate hydrate in the plating bath is less than 15 g/L, the pitch of black is inadequate. If the concentration of manganese sulfate hydrate in the plating bath is more than 30 g/L, the copper particles may fall. If the concentration of magnesium sulfate heptahydrate in the plating bath is less than 20 g/L, the pitch of black is inadequate. If the concentration of magnesium sulfate heptahydrate in the plating bath is more than 50 g/L, spots may appear. If the concentration of sodium citrate dihydrate in the plating bath is less than 80 g/L, the pitch of black is inadequate. If the concentration of sodium citrate dihydrate in the plating bath is more than 150 g/L, precipitation in the plating bath occurs.

Moreover, if the bath temperature is less than 20° C., spots may appear. On the other hand, if the bath temperature is more than 60° C., the pitch of black is inadequate. If the bath pH is less than 4, plating bath precipitation occurs. If the bath pH is more than 7, the pitch of black is inadequate. If the plating current density is less than 3 A/dm$^2$, the pitch of black is inadequate. If the plating current density is more than 20 A/dm$^2$, the copper particles may fall. If the plating time is less than 10 seconds, the pitch of black is inadequate. If the plating time is more than 30 seconds, the copper particles may fall.

Please refer to Tables 1 and 2. Table 1 shows the plating bath constitute of each embodiments and comparative examples. Table 2 shows the physical property of the composite dual blackened copper foil 1 made by different processes. The testing targets of physical properties include:

A: Stains; black spots or stripes on the appearance; judged by eye.

B: Chroma Y value; measured by color meter.

C: Gloss; measured by gloss meter.

D: Particle adhesion; pressing a filter paper on the widthwise portion of the shiny side 11 and matte side 12, sliding the filter paper from left to right for approximately 30 cm, and comparing the state of filter paper to a sample card for grading.

<Particle Adhesion Marking>
○: ≤Grade 1
Δ: Grade 1<(particle adhesion)<Grade 2
x: ≤Grade 2

E: Etching quality; making a testing sheet with line pitch/line width of 75/75 μm, dipping the test sheet in an acidic etching solution consisting essentially of 265.9 g/l copper chloride, 150 ml/l hydrogen peroxide, and 224 ml/l HCl at 55° C. for 5 minutes, removing coating in a 3 wt % NaOH at 48° C., washing the testing sheet by water, and finally examining fringe under optical microscope and scanning electronic microscope.

<Etching Quality Marking>
○: No fringe on substrate after etching
Δ: Mild fringe on substrate after etching
x: Considerable fringe on substrate after etching layer 50. The copper foil 10 has a shiny side 11 and a matte side 12. The two rough layers 20 are formed on the shiny side 11 and the matte side 12 respectively. The two blackened layers 30 are formed on the rough layers 20 respectively. The blackened layers 30 are alloy formed by electroplating in a plating bath consisting essentially of copper, cobalt, nickel, manganese, magnesium and sodium ions. The two corrosion preventive layers 40 are formed on the blackened layers 30 respectively. The silane layer 50 is formed on one of the corrosion preventive layers 40.

Specifically, the blackened layers 30 are alloy formed by electroplating in a plating bath consisting essentially of 65 g/L copper sulfate pentahydrate, 9 g/L nickel sulfate hexahydrate, 45 g/L cobalt sulfate heptahydrate, 20 g/L manganese sulfate hydrate, 35 g/L magnesium sulfate heptahydrate and 95 g/L sodium citrate dehydrate. The bath temperature ranges between 20° C. to 60° C., pH 4 to 7, and plating current density 3 A/dm$^2$ to 20 A/dm$^2$. The copper foil 10 is treated for 10 to 30 seconds.

Preferably, the copper foil 10 has a thickness between 6 to 35 μm, the shiny side 11 has a roughness (Rz) between 1.0 to

TABLE 1

| Conditions | | copper sulfate pentahydrate (g/L) | nickel sulfate hexahydrate (g/L) | cobalt sulfate heptahydrate (g/L) | manganese sulfate hydrate (g/L) | magnesium sulfate heptahydrate (g/L) | sodium citrate dihydrate (g/L) | Dual electroplating for roughness |
|---|---|---|---|---|---|---|---|---|
| Embodiment | 1 | 65 | 9 | 45 | 20 | 35 | 95 | Y |
| | 2 | 65 | 9 | 45 | 20 | 35 | 95 | Y |
| | 3 | 55 | 12 | 45 | 20 | 35 | 95 | Y |
| | 4 | 65 | 9 | 45 | 27 | 48 | 95 | Y |
| | 5 | 65 | 9 | 45 | 20 | 35 | 115 | Y |
| | 6 | 65 | 9 | 38 | 20 | 35 | 95 | Y |
| | 7 | 70 | 12 | 50 | 25 | 40 | 135 | N |
| Comparative Example | 1 | 65 | 9 | 45 | 20 | 35 | 95 | N |
| | 2 | 65 | 9 | 45 | 20 | 35 | 70 | Y |
| | 3 | 65 | 9 | 45 | 20 | — | 95 | Y |

2.0, and the matte side 12 has a roughness (Rz) between 1.0 to

TABLE 2

| | | Physical properties | | | | | | | | | |
|---|---|---|---|---|---|---|---|---|---|---|---|
| | | Stains | | Chroma (Y) | | Gloss [GS(60°)] | | Particle adhesion | | Etching quality | |
| | | S/S | M/S | S/S | M/S | S/S | M/S | S/S | M/S | S/S | M/S |
| Embodiment | 1 | ○ | ○ | 3.89 | 3.85 | 0.3 | 0.4 | ○ | ○ | ○ | ○ |
| | 2 | ○ | ○ | 3.66 | 3.68 | 0.2 | 0.3 | ○ | ○ | ○ | ○ |
| | 3 | ○ | ○ | 3.92 | 3.86 | 0.3 | 0.6 | ○ | ○ | ○ | ○ |
| | 4 | ○ | ○ | 3.83 | 3.78 | 0.6 | 0.8 | ○ | ○ | ○ | ○ |
| | 5 | ○ | ○ | 3.78 | 3.86 | 0.4 | 0.4 | ○ | ○ | ○ | ○ |
| | 6 | ○ | ○ | 3.80 | 3.82 | 0.3 | 0.5 | ○ | ○ | ○ | ○ |
| | 7 | ○ | ○ | 3.98 | 3.96 | 0.3 | 0.6 | ○ | ○ | ○ | ○ |
| Comparative Sample | 1 | X | X | 7.03 | 7.02 | 48.9 | 48.3 | ○ | ○ | ○ | ○ |
| | 2 | X | X | 5.43 | 5.38 | 23.4 | 22.8 | ○ | ○ | ○ | ○ |
| | 3 | X | X | 5.28 | 5.14 | 21.3 | 20.6 | ○ | ○ | ○ | ○ |

(S/S: shiny side; M/S: matte side)

The results show that the first to sixth embodiment of the instant disclosure have better chroma, gloss, particle adhesion and etching quality compared to the comparative samples.

Attention now is invited to FIG. 2 which shows the composite dual blackened copper foil 1 made by the aforementioned method. The composite dual blackened copper foil 1 includes a copper foil 10, two rough layers 20, two blackened layers 30, two corrosion preventive layers 40 and a silane 2.0. The chroma Y value of the two blackened layers 30 measured by the color meter should falls between 2 to 10 and preferably less than or equal to 4. The gloss of the two blackened layers 30 measured by gloss meter should falls between 0.1 to 10 and preferably less than or equal to 1.

In conclusion, the instant disclosure provides the composite dual blackened copper foil, which undergoes electrolysis in specialized treatment solution. The copper foil therefore exhibits adequate pitch of black in appearance on both sides, at the same time being spotless, powder free and good in etching quality. Furthermore, both sides of the copper foil are washed by acidic solution to remove any residues or stains and then the blackened layer is formed. Thus the chroma and gloss of the blackened layer is uniform.

The composite dual blackened copper foil also exhibits shielding effect for blocking electromagnetic waves, near infrared, undesired lighting and the like and is applicable to PDP, EMI, HDI manufacturing, direct laser drilling, inner layer manufacturing, FCCL, FPC and the like.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A composite dual blackened copper foil comprising:
a copper foil including a shiny side and a matte side; and
two blackened layers formed on the shiny side and the matte side respectively, wherein the blackened layers is an alloy formed by electroplating in a plating bath consisting essentially of copper, cobalt, nickel, manganese, magnesium and sodium ions.

2. The composite dual blackened copper foil according to claim 1 further comprising two rough layers, formed respectively between the blackened layer and the shiny side and between the blackened layer and the matte side.

3. The composite dual blackened copper foil according to claim 2 further comprising two corrosion preventive layers formed on the blackened layers respectively and a silane layer formed on one of the corrosion preventive layer.

4. The composite dual blackened copper foil according to claim 1, wherein the blackened layers are alloy formed by electroplating in a plating bath consisting essentially of 40 to 80 g/L copper sulfate pentahydrate, 5 to 15 g/L nickel sulfate hexahydrate, 30 to 60 g/L cobalt sulfate heptahydrate, 15 to 30 g/L manganese sulfate hydrate, 20 to 50 g/L magnesium sulfate heptahydrate and 80 to 150 g/L sodium citrate dehydrate, the bath temperature ranges between 20° C. to 60° C., pH value 4 to 7, plating current density 3 A/dm² to 20 A/dm² and plating time 10 to 30 seconds.

5. The composite dual blackened copper foil according to claim 1, wherein the thickness of the copper foil ranges between 6 to 35 μm, the roughness of the shiny side ranges between 1.0 to 2.0, and the roughness of the matte side ranges between 1.0 to 2.0.

6. The composite dual blackened copper foil according to claim 1, wherein a chroma Y value of the blackened layers measured by a color meter ranges between 2 to 10 and a gloss of the blackened layers measured by a gloss meter ranges between 0.1 to 10.

7. A method of manufacturing a composite dual blackened copper foil, comprising:
providing a copper foil having a shiny side and a matte side;
washing the shiny and matte sides by acidic solution;
forming a first rough layer on the shiny side and a second rough layer on the matte side; and
forming a first blackened layer on the first rough layer and a second blackened layer on the second rough layer, wherein the first and second blackened layers are alloy formed by electroplating in a plating bath consisting essentially of copper, cobalt, nickel, manganese, magnesium and sodium ions.

8. The method of manufacturing a composite dual blackened copper foil according to claim 7, after the step of forming the first and second blackened layers further comprising:
forming a first corrosion preventive layer on the first blackened layer and a second corrosion preventive layer on the second blackened layer; and
forming a silane layer on one of the corrosion preventive layers.

9. The method of manufacturing a composite dual blackened copper foil according to claim 7, wherein the first and second blackened layers are alloy formed by electroplating in a plating bath consisting essentially of 40 to 80 g/L copper sulfate pentahydrate, 5 to 15 g/L nickel sulfate hexahydrate, 30 to 60 g/L cobalt sulfate heptahydrate, 15 to 30 g/L manganese sulfate hydrate, 20 to 50 g/L magnesium sulfate heptahydrate and 80 to 150 g/L sodium citrate dehydrate, the bath temperature ranges between 20° C. to 60° C., pH value 4 to 7, plating current density 3 A/dm² to 20 A/dm² and plating time 10 to 30 seconds.

10. The method of manufacturing a composite dual blackened copper foil according to claim 7, wherein the thickness of the copper foil ranges between 6 to 35 μm, the roughness of the shiny side ranges between 1.0 to 2.0, and the roughness of the matte side ranges between 1.0 to 2.0.

11. The method of manufacturing a composite dual blackened copper foil according to claim 7, wherein a chroma Y value of the blackened layers measured by a color meter ranges between 2 to 10 and a gloss of the blackened layers measured by a gloss meter ranges between 0.1 to 10.

* * * * *